United States Patent
Fiedler et al.

(10) Patent No.: US 6,496,404 B1
(45) Date of Patent: Dec. 17, 2002

(54) MEMORY SYSTEM FOR USE ON A CIRCUIT BOARD IN WHICH THE NUMBER OF LOADS IS MINIMIZED

(75) Inventors: Larry Fiedler, Mountain View, CA (US); Simon Thomas, Campbell, CA (US); Barry Wagner, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 09/993,105

(22) Filed: Nov. 6, 2001

Related U.S. Application Data

(63) Continuation of application No. 09/690,170, filed on Oct. 6, 2000, now Pat. No. 6,362,997.

(51) Int. Cl.[7] .............................................. H01L 23/48
(52) U.S. Cl. ........................... 365/63; 365/51; 257/723; 257/724; 257/722
(58) Field of Search ..................... 365/51, 63; 257/722, 257/723, 724

(56) References Cited

U.S. PATENT DOCUMENTS

| | | | | |
|---|---|---|---|---|
| 5,835,405 | A | * 11/1998 | Tsui et al. | 365/182 |
| 5,907,507 | A | * 5/1999 | Watanabe et al. | 365/189.01 |
| 6,150,724 | A | * 11/2000 | Wenzel et al. | 257/777 |
| 6,181,163 | B1 | * 1/2001 | Agrawal et al. | 326/41 |
| 6,049,476 | A1 | * 4/2001 | Lauren et al. | 365/52 |
| 6,362,997 | B1 | * 3/2002 | Fiedler et al. | 365/63 |
| 6,417,688 | B1 | * 7/2002 | Darbral et al. | 326/30 |

FOREIGN PATENT DOCUMENTS

| | | | |
|---|---|---|---|
| JP | 402012957 | * | 1/1990 |
| JP | 406348588 | * | 12/1994 |
| JP | 02000284873 | * | 10/2000 |

* cited by examiner

Primary Examiner—Viet Q. Nguyen
(74) Attorney, Agent, or Firm—Sawyer Law Group LLP

(57) ABSTRACT

A memory system is disclosed. The memory system comprises a circuit board and at least two memory devices mounted on the circuit board. Each of the at least two memory devices includes a plurality of pins for receiving and providing signals. At least a first portion of the pins of one of the at least two memory devices are coupled to at least a second portion of the pins of the other at least two memory devices such that a pair of the first portion coupled to a pin of the second portion forms a coupled load. The coupled load then appears as one load. Accordingly, in a system in accordance with the present invention, at least two memory devices are provided on a circuit board. Each of the at least two memory devices includes a plurality of pins. At least a portion of the pins of one of the two memory devices is in close proximity to and coupled to the at least a portion of the pins of the other of the at least two memory devices such that a pin and one memory device is coupled to a pin on the other memory device to form a coupled load. The coupled load then appears as one load. This is accomplished in a preferred embodiment by allowing the pins which are on opposite sides (front and back) of a printed circuit board to be represented as one load and then remapping one of the oppositely disposed pins to have the same functionality as the other oppositely disposed pin.

17 Claims, 5 Drawing Sheets

MEMORY SYSTEM FOR USE ON A CIRCUIT BOARD IN WHICH THE NUMBER OF LOADS IS MINIMIZED

This application is a continuation of application Ser. No. 09/690,170 filed Oct. 6, 2000, now U.S. Pat. No. 6,362,997.

FIELD OF THE INVENTION

The present invention relates generally to memory devices and more particularly to a memory system for use on a circuit board where the number of loads is minimized.

BACKGROUND OF THE INVENTION

Memory devices are utilized extensively in printed circuit boards (PCBs). Oftentimes, these memory devices are utilized in both sides of the PCB. To save space on such boards, it is desirable to place these devices on opposite sides of the boards such that they are mirror images of each other.

FIG. 1 illustrates a representative pin assignment of the address pins for a memory device. In this embodiment, the device 10 includes address pins $A_0$–$A_{11}$. As is seen, address pins $A_0$–$A_5$ are on one side of the device 10 and address pins $A_{11}$–$A_6$ are on an opposite side of the device. The memory device 10 is preferably a dynamic random access memory (DRAM). For purposes of clarity, only the portions of the memory device relevant to the explanation are described herein. One of ordinary skill in the art readily recognizes that there are other pins such as data pins, power pin and ground pins, and the like that are utilized on the memory device. It is also understood that the particular pin assignment locations are not relevant. The important factor is that memory devices have fixed pin assignments.

Accordingly, if identical memory devices are placed on the opposite sides of the PCB, a pin on one side of the device is opposite its corresponding pin on the other side of the PCB. Typically, to utilize the corresponding pins simultaneously, the corresponding pins are connected by an electrical connection referred to as a via which couples the pin to a driver. In conventional systems, these connections have not created many problems, but as device sizes become smaller and device speeds become faster, these connections look more and more like transmission lines and have the attendant problems associated therewith such as reflections on the lines. Hence, signal integrity techniques must be utilized to ensure these transmission line problems are minimized.

To illustrate this, refer to the following description in conjunction with the accompanying figures. FIGS. 2 and 3 illustrate simplified top front views of the connections of common address pins of two identical DRAMs on opposite sides of a portion of a PCB 12. For the sake of simplicity, it should be understood that these figures are for illustrative purposes only to allow for a straightforward description of this feature. One of ordinary skill in the art recognizes that there are many more pins and many more connections than that shown in these figures.

For ease of understanding, FIG. 2 illustrates the conventional coupling of corresponding pins $A_0$ to $A_5$ connections between two memory devices on the front and back of the portion of the PCB 12, and FIG. 3 illustrates the conventional coupling of corresponding pins $A_{11}$–$A_6$ between the two memory devices. Hence, in FIG. 2, pins $A_0$–$A_5$, the pins on top of the portion of the PCB 12, are shown on the right hand side of FIG. 2, and their corresponding pins $A_0'$–$A_5'$, the pins on the bottom of the PCB 12, are shown on the left-hand side. Similarly, pins $A_{11}$–$A_6$ on the top of the portion of the PCB 12 are on the left-hand side of FIG. 3, and pins $A'_{11}$–$A'_6$ on the bottom of the portion of the PCB 12 are on the right-hand side. Hence, as is seen, all of the corresponding pins (($A_0$, $A'_0$,) ($A_1$, $A_1'$), etc.) are also opposite each other.

Typically, as is seen in these figures, vias 16a–16f and 16a'16f' are utilized to connect the appropriate corresponding pins ($A_0$, $A_0'$) etc. to 20a–20f and 20a'-20f' drive pins. Accordingly, each of pins 20a–20f and 20a'-20f' are utilized to drive two loads (i.e., pins ($A_0$, $A_0'$) etc.).

As before mentioned, as device sizes become smaller and device speeds become higher, these connections look more and more like transmission lines. As a result, signal integrity techniques must be utilized to ensure that transmission line effects are minimized. These signal integrity techniques are complex as well as adding significant expense to the overall system. Since cost is always a factor in integrated circuit design, it is always desirable to minimize costs associated therewith. Therefore, it is readily apparent as the number of pins increase on a memory device, the number of loads increase in a corresponding fashion which is also very undesirable.

Accordingly, what is desired is a system to minimize the number of loads when utilizing multiple memory chips on each side of the board. The system should be straightforward, should not add undue complexity or cost to the system, and be easy to implement on existing architectures. The present invention addresses such a need.

SUMMARY OF THE INVENTION

A memory system is disclosed. The memory system comprises a circuit board and at least two memory devices mounted on the circuit board. Each of the at least two memory devices includes a plurality of pins for receiving and providing signals. At least a first portion of the pins of one of the at least two memory devices are coupled to at least a second portion of the pins of the other two memory devices such that a first portion coupled to a pin of a second portion forms a coupled load. The coupled load then appears as one load.

Accordingly, in a system in accordance with the present invention, at least two memory devices are provided on a circuit board. Each of the at least two memory devices includes a plurality of pins. At least a portion of the pins of one of the two memory devices is in close proximity to and coupled to the at least a portion of the pins of the other of the at least two memory devices such that a pin and one memory device is coupled to a pin on the other memory device to form a coupled load. The coupled load then appears as one load. This is accomplished in a preferred embodiment by allowing the pins which are on opposite sides (front and back) of the printed circuit board to be represented as one load and then remapping one of the oppositely disposed pins to have the same functionality as the other oppositely disposed pin.

DETAILED DESCRIPTION

The present invention relates generally to memory devices and more particularly to a memory system for use on a circuit board where the number of loads is minimized. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In a system in accordance with the present invention, the functions of the pins on one of at least two memory devices on the PCB are remapped to minimize the number of loads on the PCB. In so doing, a plurality of pins can be represented as one load. This is accomplished in a preferred embodiment by allowing the pins which are on opposite sides (front and back) of the PCB device to be represented as one load and then remapping one of the oppositely disposed is pins to have the same functionality as the other oppositely disposed pin.

To describe the features of the present invention in more detail, refer now to the following description in conjunction with the accompanying figures.

Figure 1:
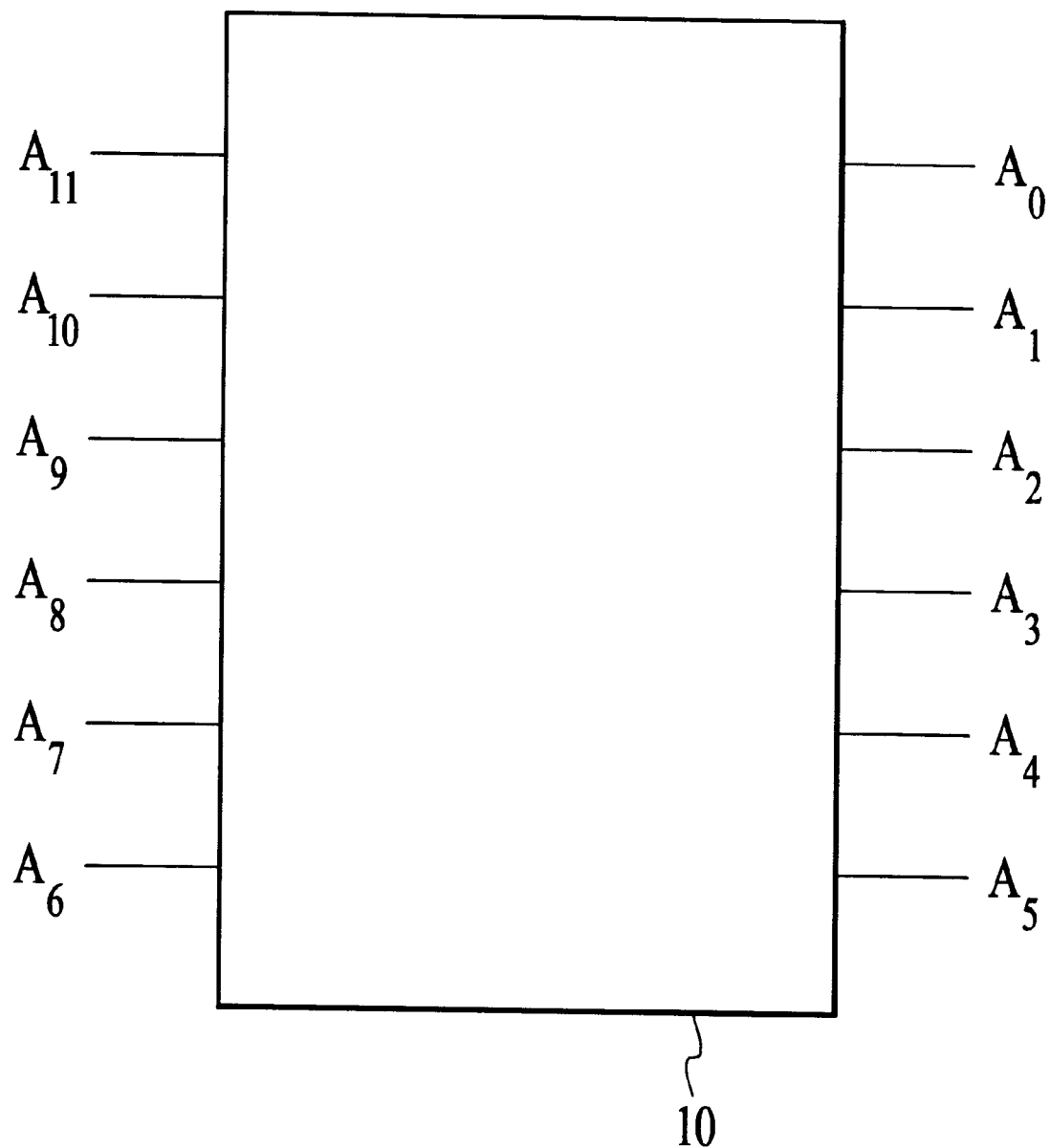
FIG. 1 is an illustration of a pin assignment for a conventional dynamic random access memory (DRAM).
Figure 2:
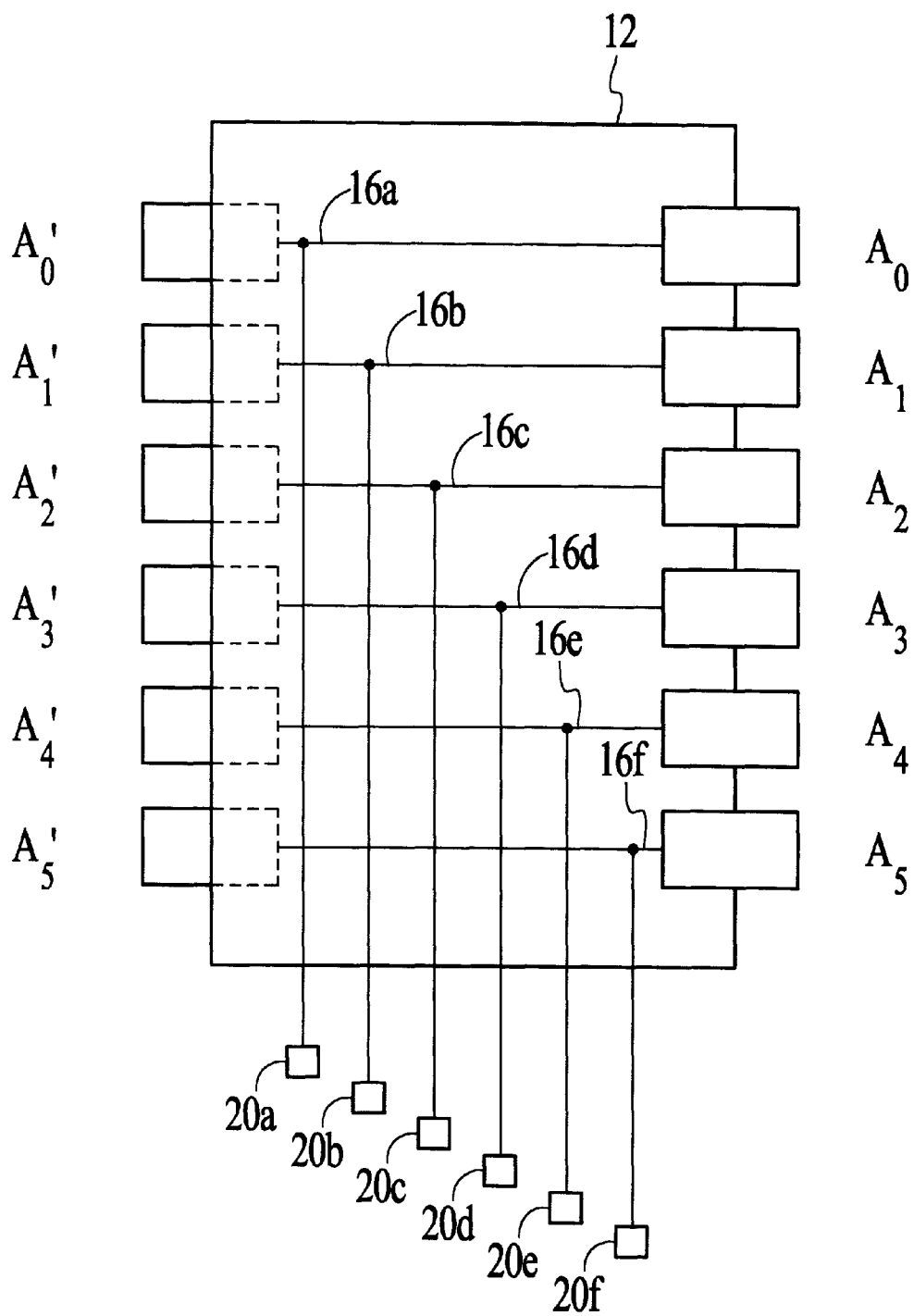
FIGS. 2 and 3 illustrate simplified front views of the connection of common pins of the two DRAMs.
Figure 3:
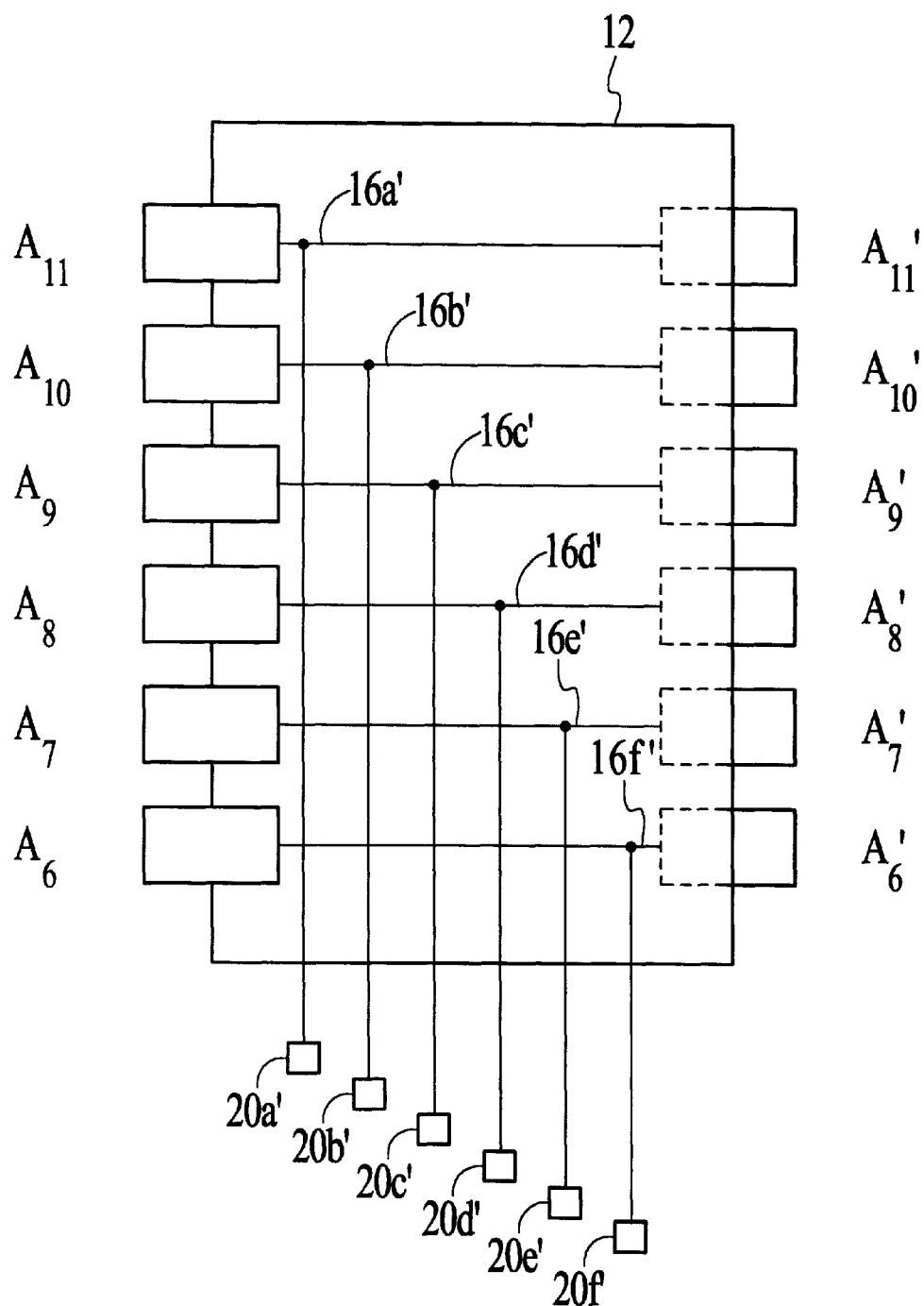
Figure 4:
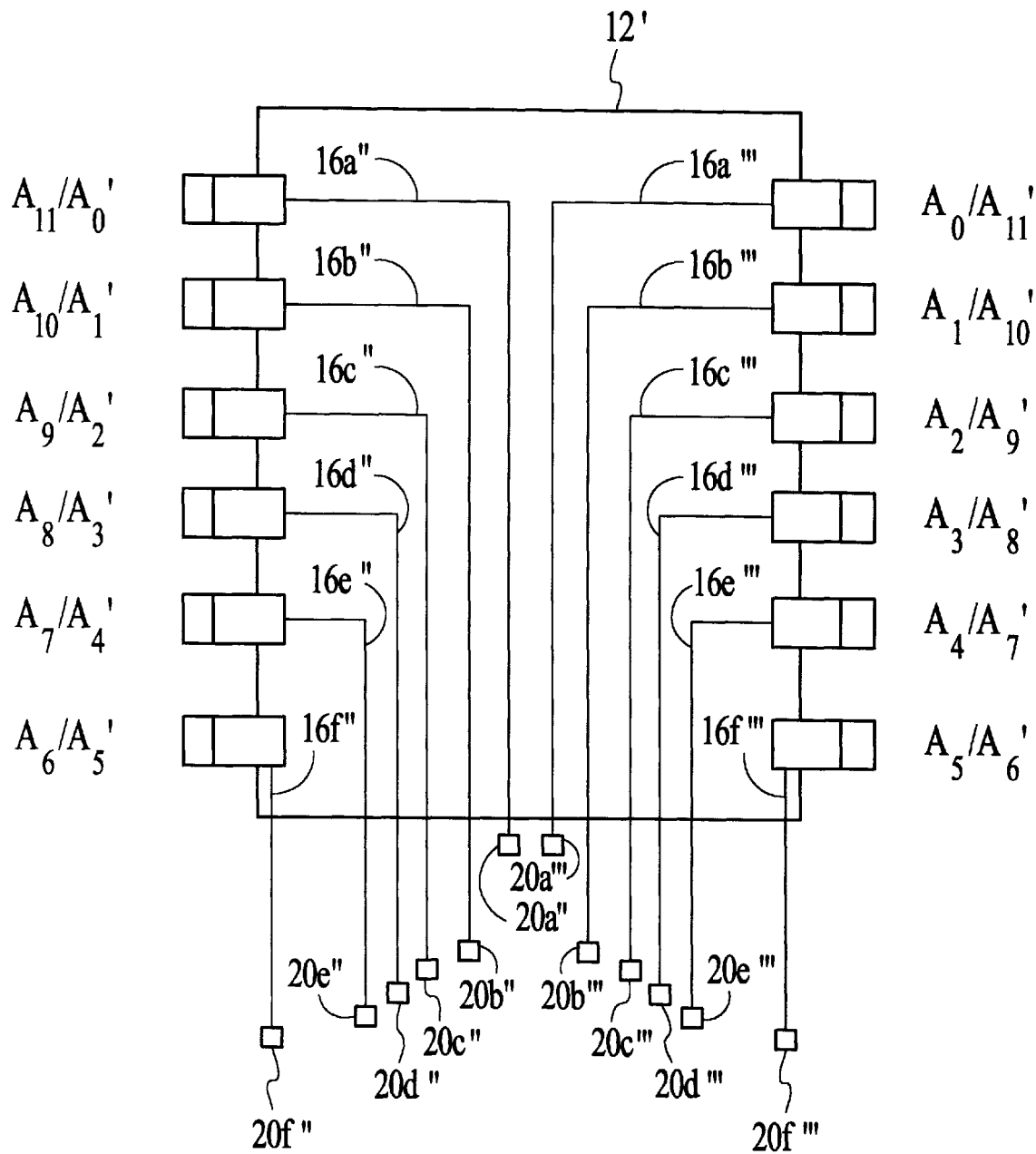
FIG. 4 illustrates a simplified block diagram of the connections of common pins in accordance with the present invention.

FIG. 4 illustrates a simplified block diagram of the connections of common pins in accordance with the present invention. As is seen, pins on opposite sides of the PCB 12' are coupled together such that they appear as one load. Hence, as is seen, on the right hand side, pins $A_0/A_{11}'$, $A_1/A_{10}'$, $A_2/A_9'$, $A_3/A_8'$, $A_4/A_7'$ and $A_5/A_6'$ each appear as one load to their respective driverpins $20a''-20f''$ due to their close proximity to each other. Similarly, the left-hand side pins $A_{11}/A_0'$, $A_{10}/A_1'$, $A_9/A_2'$, $A_8/A_3'$, $A_7/A_4'$, and $A_6/A_5'$ each appear as one load to their respective driver pins $20a'''-20f'''$. Accordingly, through a system and method in accordance with the present invention, the number of loads are minimized as well as minimizing the transmission line effects associated with conventional systems.

In a preferred embodiment, the memory devices are identical and are placed oppositely disposed to each other, on a front and back side of the PCB 12'. In so doing, the pins are adjacent with each other and the connection length therebetween is minimized. However, one of ordinary skill in the art readily recognizes the memory devices can be in any relationship to each other (i.e., side by side), the key feature being that at least a portion of the pins of each device appear as one load to a driving pin.

To effectively utilize this arrangement, particularly for address pins, the functionality of the pins must be defined properly. Addressing is important because the location of the bits associated with the address is important. The bits are important because they indicate a particular physical location in memory. Accordingly, it is important to make sure that the appropriate bits are utilized to address the appropriate locations in memory.

To ensure that the pins are properly defined, a remapping of the pins occurs to ensure proper operation of the memory devices. To describe this remapping feature in more detail, refer now to the following description in conjunction with the accompanying figure.

Figure 5:
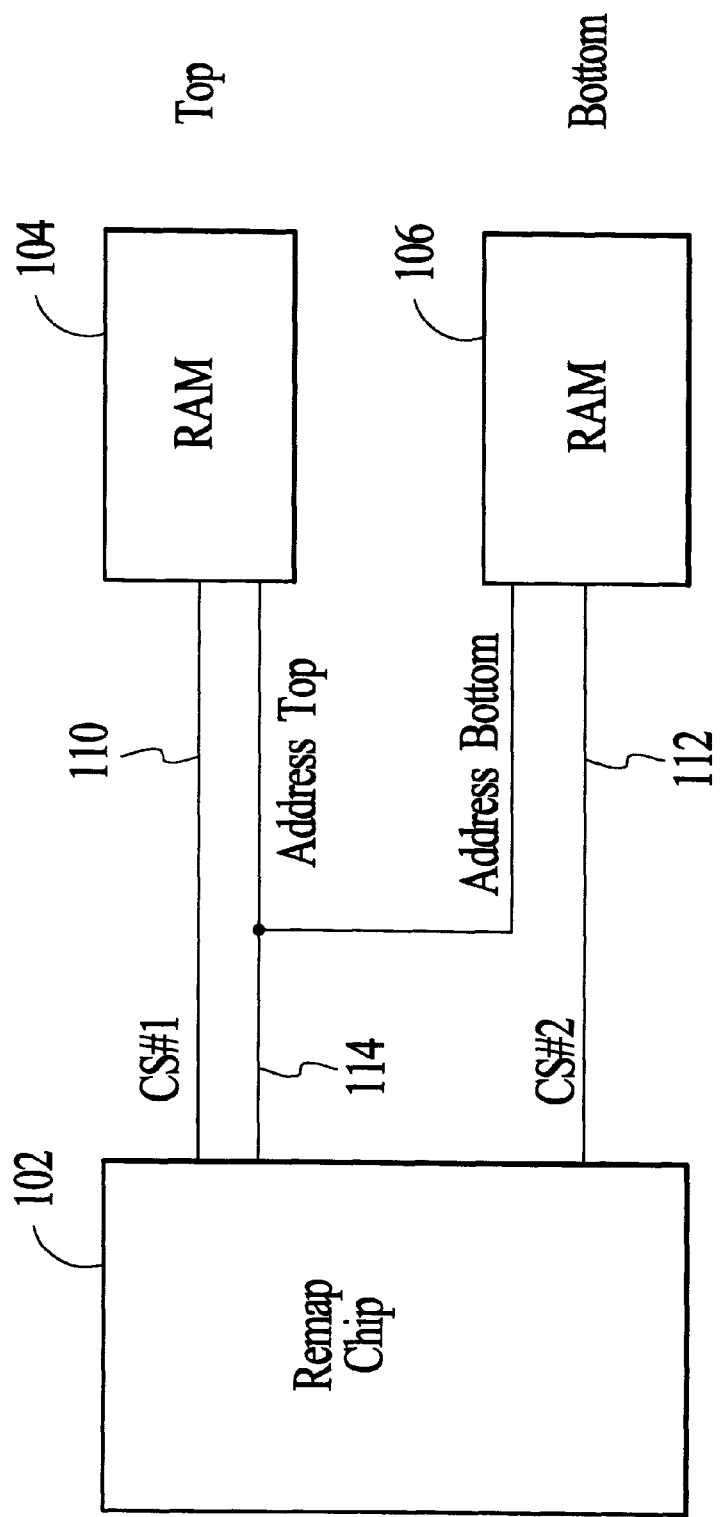
FIG. 5 illustrates a simple block diagram of a system for remapping the address pins in accordance with the present invention.

FIG. 5 illustrates a simple block diagram of a system 100 for remapping the address pins in accordance with the present invention. The system 100 includes a remapping chip 102 which is coupled to the memory devices 104 and 106. In this embodiment, memory device 104 is on top of the PCB (not shown) and memory device 106 is on the bottom of the PCB. Accordingly, the remapping chip 102 provides for two chip select signals 110 and 112 at the appropriate time. That is if the remapping chip 102 is to select memory device 104, then chip select 110 is enabled and if the remapping chip 102 is to select memory device 106, then chip 112 is enabled. Only one of the chip select signals 110 and 112 is enabled at a time. Accordingly, when chip select 110 is provided, the address signal for the pin of the memory device 104 is provided. On the other hand, if chip select 112 is enabled, the address signal for the pin for the memory device 106 is provided. The remapping chip allows in this case, the bottom memory device 106 address pin for particular address signal to remap to a different location.

In a specific example, referring back to FIG. 4, if address for pin $A_0$ is selected, then the pin $A_0$ for top memory device 104 is selected if the chip select 110 is enabled. However, if the chip select 112 is enabled, the address is remapped to pin $A_{11}$ on the bottom memory device 106. This functionality can be repeated for each of the oppositely disposed pins. The remapping chip can be implemented in a variety of conventional ways from a look up table which directly maps the appropriate pin from one device to the pin of the other device to a multiplexer arrangements which allows for many configurations.

Accordingly, in a system in accordance with the present invention, at least two memory devices are provided on a circuit board. Each of the at least two memory devices includes a plurality of pins. At least a portion of the pins of one of the two memory devices is in close proximity to and coupled to the at least a portion of the pins of the other of the at least two memory devices such that a pin and one memory device is coupled to a pin on the other memory device to form a coupled load. The coupled load then appears as one load. This is accomplished in a preferred embodiment by allowing-the pins which are on opposite sides (front and back) of the printed circuit board to be represented as one load and then remapping one of the oppositely disposed pins to have the same functionality as the other oppositely disposed pin. Accordingly, through the use of a memory system in accordance with the present invention, the transmission line problems associated with conventional systems are minimized.

Although the present invention has been described in accordance with the embodiments shown, one of ordinary skill in the art will readily recognize that there could be variations to the embodiments and those variations would be within the spirit and scope of the present invention. For example, although the present invention is described in the context of a printed circuit board, one of ordinary skill in the art readily recognizes that any insulating material upon which a plurality of memory devices are located could be utilized and that would be within the spirit and scope of the present invention. Therefore, memory devices could be placed on an integrated circuit and that use would be within the spirit and scope of the present invention. Accordingly, many modifications may be made by one of ordinary skill in the art without departing from the spirit and scope of the appended claims.

What is claimed is:

1. A memory system comprising:

a circuit board; and at least two memory devices mounted on the circuit board; each of the at least two memory devices including a plurality of pins for receiving and providing signals; each of the at least two memory devices being identical, wherein at least a first portion of the pins of one of the at least two memory devices are coupled to at least a second portion of the pins of the other at least two memory devices such that a pin of the first portion coupled to a pin of the second portion forms a coupled load, wherein the coupled load appears as one load.

2. The memory system of claim 1 wherein the signals comprise address signals.

3. The memory system of claim 1 which includes a remapping device that is coupled to the at least two memory devices for ensuring that the appropriate pins are defined properly.

4. The memory system of claim 1 wherein the at least two memory devices are identical and disposed on opposite sides of the circuit board such that the pins on each of the at least two memory devices are mirror images of each other.

5. The memory system of claim 4 wherein a remapping device is coupled to the first and second memory devices for ensuring that the appropriate pins are defined properly.

6. The memory system of claim 5 wherein the remapping device comprises a look-up table.

7. The memory system of claim 6 wherein the remapping device comprises a multiplexor arrangement.

8. A memory system comprising:

a circuit board;

first and second memory devices mounted on the circuit board; each of the first and second memory devices including a plurality of pins for receiving and providing address signals; wherein the first and second memory devices are identical and disposed on opposite sides of the circuit board such that the pins on each of the first and second memory devices are mirror images of each other; wherein at least a first portion of the pins of one of the first memory device is coupled to at least a second portion of the pins of the second memory device such that a pin of the first portion coupled to a pin of the second portion forms a coupled load, wherein the coupled load appears as one load; and a remapping device is coupled to the first and second memory devices for ensuring that the appropriate pins are defined properly.

9. The memory system of claim 8 wherein the remapping device comprises a look-up table.

10. The memory system of claim 8 wherein the remapping device comprises a multiplexor arrangement.

11. A memory system comprising:

a circuit board; and first and second memory devices mounted on the circuit board; each of the first and second memory devices including a plurality of pins for receiving and providing address signals; wherein the first and second memory devices are identical and disposed on opposite sides of the circuit board such that the pins on each of the first and second memory. devices are mirror images of each other; wherein at least a first portion of the pins of one of the first memory device is coupled to at least a second portion of the pins of the second memory device such that a pin of the first portion coupled to a pin of the second portion forms a coupled load, wherein the coupled load appears as one load.

12. A memory system comprising:

a circuit board; and first and second memory devices mounted and positioned on opposite sides of the circuit board, each of the first and second memory devices including a plurality of pins, wherein a different pin from each of the first and second memory devices are coupled together to form a coupled load.

13. The memory system of claim 12 wherein the plurality of pins each of the first and second memory devices are mirror images of each other.

14. The memory system of claim 12 wherein the signals comprise address signals.

15. The memory system of claim 12 wherein a remapping device is coupled to the first and second memory devices for ensuring that the appropriate pins are defined properly.

16. The memory system of claim 15 wherein the remapping device comprises a look-up table.

17. The memory system of claim 15 wherein the remapping device comprises a multiplexor arrangement.

* * * * *